United States Patent
Han et al.

(10) Patent No.: US 9,595,315 B2
(45) Date of Patent: Mar. 14, 2017

(54) SEMICONDUCTOR MEMORY DEVICE COMPENSATING DIFFERENCE OF BITLINE INTERCONNECTION RESISTANCE

(71) Applicant: SAMSUNG ELECTRONICS CO., LTD., Suwon-si, Gyeonggi-do (KR)

(72) Inventors: Joon Han, Hwaseong-si (KR); Won-Kyung Park, Seoul (KR); Junhee Lim, Seoul (KR); Sungho Jang, Seoul (KR)

(73) Assignee: Samsung Electronics Co., Ltd., Suwon-si, Gyeongg-do (KR)

( * ) Notice: Subject to any disclaimer, the term of this patent is extended or adjusted under 35 U.S.C. 154(b) by 0 days.

(21) Appl. No.: 14/734,315

(22) Filed: Jun. 9, 2015

(65) Prior Publication Data
US 2016/0078919 A1    Mar. 17, 2016

(30) Foreign Application Priority Data

Sep. 17, 2014  (KR) .................. 10-2014-0123777

(51) Int. Cl.
| G11C 11/4091 | (2006.01) |
| G11C 5/02 | (2006.01) |
| G11C 11/4094 | (2006.01) |

(52) U.S. Cl.
CPC ............ *G11C 11/4091* (2013.01); *G11C 5/02* (2013.01); *G11C 11/4094* (2013.01); *G11C 2207/002* (2013.01)

(58) Field of Classification Search
CPC ................................. G11C 11/4091
USPC ................................. 365/206, 207
See application file for complete search history.

(56) References Cited

U.S. PATENT DOCUMENTS

| 5,696,726 A | 12/1997 | Tsukikawa | |
| 5,701,269 A * | 12/1997 | Fujii | G11C 7/14 365/185.13 |
| 5,859,799 A * | 1/1999 | Matsumoto | G11C 5/14 365/189.09 |

(Continued)

FOREIGN PATENT DOCUMENTS

| JP | H 08-315575 A | 11/1996 |
| JP | 2002-344304 A | 11/2002 |

(Continued)

OTHER PUBLICATIONS

R. Jacob baker, 1964, "CMOS Circuit Design, Layout, and Simulation", Third Edition.*

*Primary Examiner* — Anthan Tran
*Assistant Examiner* — Mushfique Siddique
(74) *Attorney, Agent, or Firm* — Lee & Morse, P.C.

(57) ABSTRACT

A semiconductor memory device includes a bit line sense amplifier, a first column select gate, and a second column select gate. The bit line sense amplifier senses an electric potential difference between a bit line and a complementary bit line during a sensing operation for memory cells. The first column select gate transfers an electric potential on the bit line to a local sense amplifier based on a column select signal. The second column select gate transfers an electric potential on the complementary bit line to the local sense amplifier based on the column select signal. The first and second column select gates have different current drive abilities to compensate a difference in bit line interconnection resistance.

12 Claims, 20 Drawing Sheets

(56) References Cited

U.S. PATENT DOCUMENTS

| | | | |
|---|---|---|---|
| 6,262,922 B1* | 7/2001 | Nakamura | G11C 7/1048 365/189.04 |
| 6,521,960 B2* | 2/2003 | Lee | G11C 7/1048 257/369 |
| 6,888,771 B2 | 5/2005 | Hush et al. | |
| 7,903,489 B2 | 3/2011 | Ohgami et al. | |
| 8,027,214 B2 | 9/2011 | Lin et al. | |
| 8,208,331 B2 | 6/2012 | Lin et al. | |
| 2001/0026496 A1* | 10/2001 | Hidaka | G11C 11/4096 365/230.03 |
| 2002/0171453 A1 | 11/2002 | Kanamori et al. | |
| 2003/0163792 A1* | 8/2003 | Xie | G06F 17/505 716/113 |
| 2005/0232044 A1 | 10/2005 | Akiyama et al. | |
| 2006/0274590 A1 | 12/2006 | Fujita et al. | |
| 2007/0104003 A1 | 5/2007 | Kang | |
| 2007/0109904 A1* | 5/2007 | Hong | G11O 5/063 365/230.03 |
| 2007/0195631 A1* | 8/2007 | Hoffmann | G11C 7/06 365/230.03 |
| 2010/0074041 A1* | 3/2010 | Kim | G11C 11/4091 365/207 |
| 2010/0118593 A1* | 5/2010 | Cho | H01L 45/148 365/148 |
| 2011/0216616 A1* | 9/2011 | Ko | G11C 7/06 365/207 |
| 2012/0195146 A1* | 8/2012 | Jun | G11C 7/062 365/203 |
| 2012/0213025 A1 | 8/2012 | Koo | |
| 2014/0003177 A1* | 1/2014 | In Chul | G11C 7/06 365/207 |

FOREIGN PATENT DOCUMENTS

| | | |
|---|---|---|
| JP | 2005-293759 A | 10/2005 |
| JP | 2006-338793 A | 12/2006 |
| KR | 10-2010-0034989 A | 4/2010 |
| KR | 10-2010-0093425 A | 8/2010 |
| KR | 10-2011-0047501 A | 5/2011 |
| KR | 10-2012-0096294 A | 8/2012 |
| KR | 10-2014-0004434 A | 1/2014 |

* cited by examiner

SEMICONDUCTOR MEMORY DEVICE COMPENSATING DIFFERENCE OF BITLINE INTERCONNECTION RESISTANCE

CROSS-REFERENCE TO RELATED APPLICATION

Korean Patent Application No. 10-2014-0123777, filed on Sep. 17, 2014, and entitled, "Semiconductor Memory Device Compensating Difference Of Bitline Interconnection Resistance," is incorporated by reference herein in its entirety.

BACKGROUND

1. Field

One or more embodiments described herein relate to a semiconductor memory device that compensates a difference of bit line interconnection resistance.

2. Description of the Related Art

A data processing system may use a dynamic random access memory (DRAM) as a work memory. A DRAM may include a plurality of memory cells formed by one access transistor and one storage capacitor. Each memory cell is connected to a bit line and a word line for performing read and write operations.

During a read operation, data stored in a memory cell is sensed by a bit line sense amplifier connected to a bit line pair including a bit line and a complementary bit line. Data sensed by the bit line sense amplifier is differentially transferred to a local sense amplifier by a column select transistor pair.

SUMMARY

In accordance with one or more embodiment, a semiconductor memory device includes a memory cell array including a plurality of memory cells; a bit line sense amplifier to sense an electric potential difference between a bit line and a complementary bit line during a sensing operation for the memory cells; a first column select gate to transfer an electric potential on the bit line to a local sense amplifier based on a column select signal; and a second column select gate to transfer an electric potential on the complementary bit line to the local sense amplifier based on the column select signal, wherein the first and second column select gates have different current drive abilities from each other to compensate a difference in bit line interconnection resistance.

When an interconnection length between the bit line and the first column select gate is longer than an interconnection length between the complementary bit line and the second column select gate, the current drive ability of the first column select gate may be greater than the current drive ability of the second column select gate. A length of the first column select gate may be less than a length of the second column select gate. A width of the first column select gate may be greater than a width of the second column select gate. The first column select gate may correspond to an N-type MOS transistor.

When an interconnection length between the complementary bit line and the second column select gate is greater than an interconnection length between the bit line and the first column select gate, the current drive ability of the second column select gate may be greater than the current drive ability of the first column select gate. A length of the second column select gate may be less than a length of the first column select gate. A width of the second column select gate may be greater than a width of the first column select gate. The second column select gate may correspond to an N-type MOS transistor. The bit line sense amplifier may be a folded type bit line sense amplifier.

In accordance with one or more other embodiments, a semiconductor memory device includes a memory cell array having a plurality of memory cells, each of the memory cells including one access transistor and one storage capacitor; a cross-coupled type bit line sense amplifier to sense an electric potential difference of a bit line pair during a sensing operation for reading data stored in at least one memory cell of the plurality of memory cells; and first and second column select gates connected to the bit line sense amplifier to transfer an electric potential on the bit line pair to a local sense amplifier, wherein the first and second column select gates have different sizes from each other to compensate a difference in bit line interconnection length.

When a bit line interconnection length of the first column select gate is greater than a bit line interconnection length of the second column select gate, a size of the first column select gate may be greater than a size of the second column select gate. A length of the first column select gate may be less than a length of the second column select gate. A width of the first column select gate may be greater than a width of the second column select gate. The bit line sense amplifier may perform a folded type sensing operation for the memory cell array.

In accordance with one or more other embodiments, a circuit includes a first column select gate to transfer an electric potential on a first bit line to a sense amplifier based on a column select signal; and a second column select gate to transfer an electric potential on a second bit line to the sense amplifier based on the column select signal, the first and second bit lines being complementary bit lines, wherein: the first bit line is separated from the first column select gate by a first interconnection length, the second bit line is separated from the second column select gate by a second interconnection length, and the first and second column select gates have different current drive abilities based on a difference between the first and second interconnection lengths.

The first interconnection length may be greater than the second interconnection length, and the current driving ability of the first column select gate may be greater than the current driving ability of the second column select gate. The different current driving abilities may reduce a difference in interconnection resistance between the first and second bit lines. A length of the first column select gate may be less than a length of the second column select gate. A width of the first column select gate may be greater than a width of the second column select gate.

BRIEF DESCRIPTION OF THE FIGURES

Features will become apparent to those of skill in the art by describing in detail exemplary embodiments with reference to the attached drawings in which.

DETAILED DESCRIPTION

Figure 1:
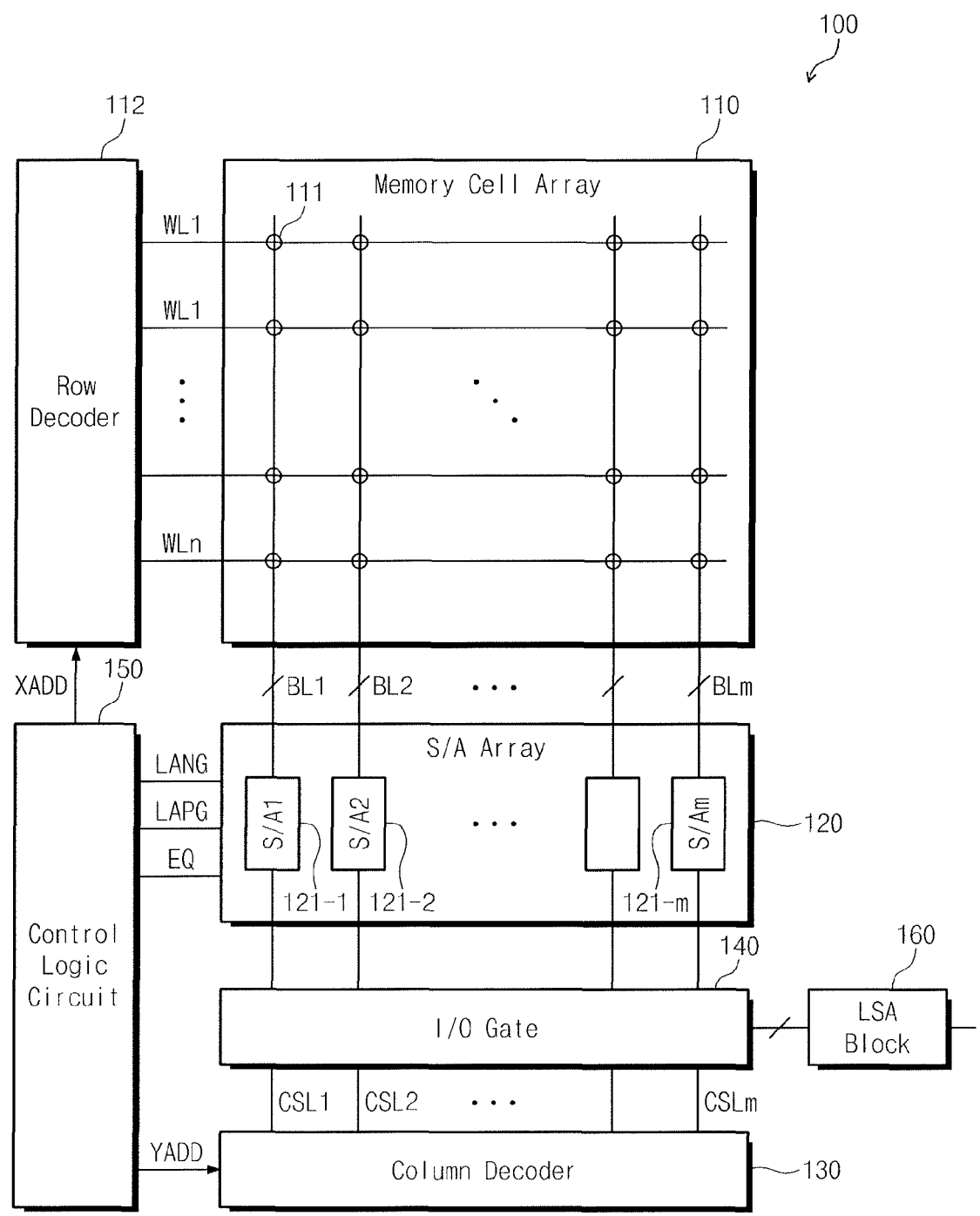
FIG. 1 illustrates an embodiment of a semiconductor memory device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments. Like reference numerals refer to like elements throughout.

FIG. 1 illustrates an embodiment of a semiconductor memory device 100 which includes a memory cell array 110, a row decoder 112, a sense amplifier array 120, a column decoder 130, an input/output gate 140, a control logic circuit 150, and a local sense amplifier block 160.

The memory cell array 110 includes a plurality of memory cells 111 arranged in a matrix form of rows and columns. Each memory cell 111 is connected to one of a plurality of word lines WL1~WLn (n is an integer) and one of a plurality of bit lines BL1~BLm (m is an integer). The memory cell 111 may be divided into a normal memory cell and a redundant memory cell. The redundant memory cell is used to replace a defective normal memory cell. Each of the bit lines BL1~BLm includes a bit line and a complementary bit line.

The memory cell 111 may be a volatile memory cell or a nonvolatile memory cell. Examples of a volatile memory include a DRAM (dynamic random access memory), a SRAM (static random access memory), a TRAM (thyristor RAM), a Z-RAM (zero capacitor RAM), or a TTRAM (twin transistor RAM).

Examples of a nonvolatile memory include an electrically erasable programmable read-only memory (EEPROM), a flash memory, a magnetic random access memory (MRAM), a spin-transfer torque MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory. One or more bits may be stored in the nonvolatile memory cell.

The row decoder 110 decodes a row address XADD to activate a corresponding word line among the word lines WL1~WLn. In a word line activation operation (e.g., a word line enable operation), a high power supply voltage VPP higher than a power supply voltage VDD may be applied to a gate of an access transistor of a memory cell.

The sense amplifier array 120 includes bit line sense amplifiers 121-1~121-$m$ in an array form. Each of the bit line sense amplifiers 121-1~121-$m$ senses and amplifies data output from a corresponding memory cell 111. A bit line sense amplifier 121-1 may be connected to a bit line pair, which includes a bit line and a complementary bit line, to sense and amplify an electric potential on a bit line BL1. For example, the bit line BL1 may correspond to a bit line pair in a folded bit line sense amplifier type. Each of the bit line sense amplifiers 121-1~121-$m$ may be a cross-coupled differential sense amplifier embodied, for example, by a P-type sense amplifier and an N-type sense amplifier.

The bit line sense amplifiers 121-1~121-$m$ are circuit devices normally operating when a semiconductor memory device operates and are distinguished from dummy sense amplifiers in an area other than the area in which the sense amplifier array 120 is embodied.

The column decoder 130 decodes a column address YADDk to generate column select signals CSL1~CSLm. Based on the column select signals CSL1~CSLm, a column select gate in the input/output gate 140 transfers an electric potential output from the bit line sense amplifiers 121-1~121-$m$ to local sense amplifiers in the local sense amplifier block 160. For example, a column select gate pair drives an electric potential being output from a corresponding sense amplifier connected to a bit line pair, to transfer the electric potential to an input stage pair of a corresponding local sense amplifier.

The control logic circuit 150 receives a command, an address, and write data from a processor or a memory controller. The control logic circuit 150 generates one or more control signals (e.g., XADD, YADD, LANG, LAPG, and EQ) for an access operation (e.g., a write operation or a read operation) with respect to the memory cell array 110 based on the command and the address.

Figure 2:
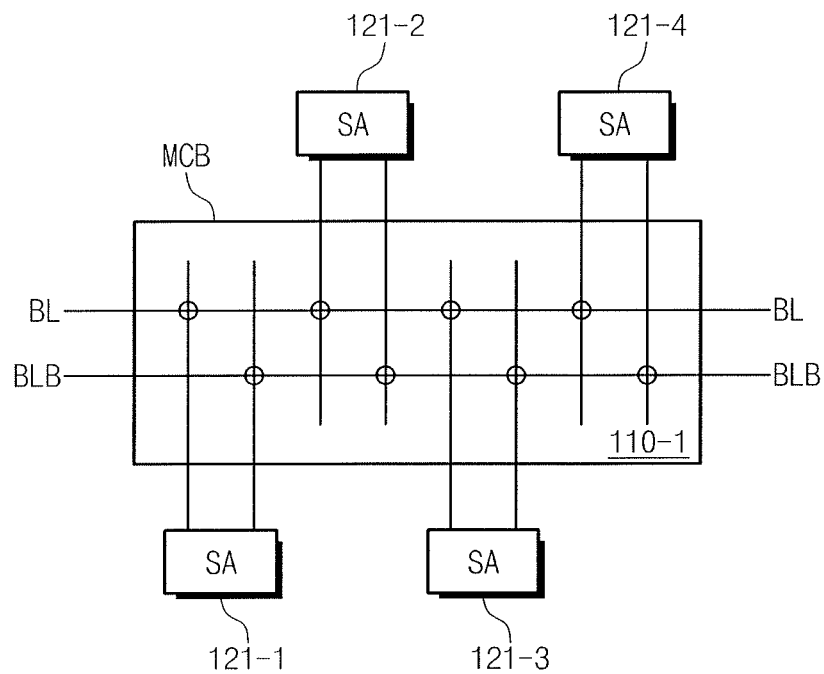
FIG. 2 illustrates a connection embodiment of a bit line sense amplifier.

FIG. 2 illustrates an embodiment of a connection form of the bit line sense amplifier 121 of FIG. 1. FIG. 2 illustrates that four bit line sense amplifiers in the sense amplifier array 120 are connected to a bit line pair. The bit line sense amplifiers are connected to a bit line pair in the same memory cell block MCB in a structure known as a folded bit line sense amplifier type. The memory cell block MCB is in the memory cell array 110 of FIG. 1. The memory cell array 110 includes a plurality of memory banks, and each memory bank includes a plurality of memory cell blocks.

A bit line structure in a semiconductor memory device may be classified into an open line structure and a folded bit line structure. In a semiconductor memory device having a folded bit line structure, a bit line and a complementary bit line all exist in one memory block. In a semiconductor memory device having an open bit line structure, a bit line and a complementary bit line exist in different memory blocks spaced apart from each other with a bit line sense amplifier as the center. For example, a bit line of the bit line sense amplifier is in a first memory block and a complementary bit line is in a second memory block facing the first memory block across the sense amplifier. Since a bit line pair is relatively far away from each other in an open bit line structure, as compared with the folded bit line structure, it may be significantly affected by deviations of a process condition or by noise deviation. In one embodiment, a bit line sense amplifier of a folded bit line structure has a superior sensing property compared with a bit line sense amplifier having an open bit line structure.

Figure 3:
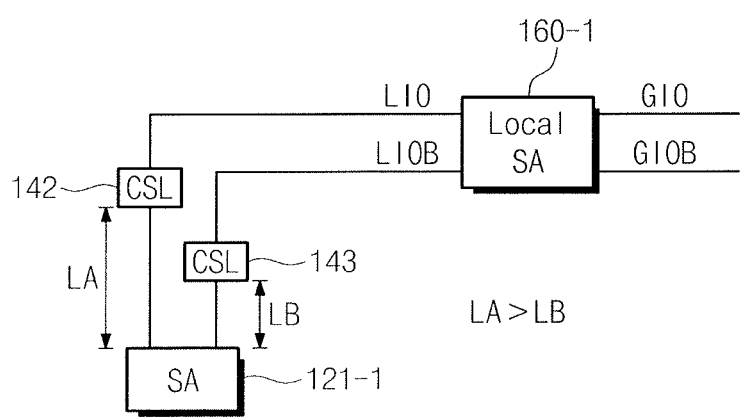
FIG. 3 illustrates an example of a data output path of the bit line sense amplifier.

FIG. 3 illustrates an embodiment of a data output path of one bit line sense amplifier of FIG. 2. For example, in FIG. 3, an output path between a bit line sense amplifier 121-1 and a local sense amplifier 160-1 is illustrated. The local sense amplifier 160-1 amplifies an electric potential received to a local input/output line pair LI0 and LI0B to output the amplified electric potential to a global input/output line pair GI0 and GI0B. The global input/output line pair GI0 and GI0B may be connected to an input/output buffer buffering a data input/output.

A bit line pair connected to the bit line sense amplifier 12-1 is connected to the local input/output line pair LI0 and LI0B through a column select gate pair CSL. A first column select gate 142 including the column select gate pair CSL electrically connects the bit line BL to the local input/output line LI0. A second column select gate 143 including the column select gate pair CSL electrically connects the complementary bit line BLB to the complementary local input/output line LI0B.

Due to a disposal structure of the bit line sense amplifier and the column select transistor pair, a first connection distance LA between the bit line BL and the first column select gate 142 may be different from a second connection distance LB between the complementary bit line BLB and the second column select gate 143. When the first connection distance LA and the second connection distance LB are different from each other, a difference in bit line interconnection resistance occurs. The resistance of a relatively long interconnection tends to be great. As a design rule is gradually reduced, the timing margin of an alternating current signal may be reduced and thereby a difference of a bit line interconnection resistance may cause a read error.

Thus, in one embodiment, to minimize or reduce the difference of bit line interconnection resistance, a current drive ability of a column select gate connected to a relatively long line may be relatively large. To make the current drive ability relatively large, the size of a transistor including a column select gate may be increased.

Figure 4:
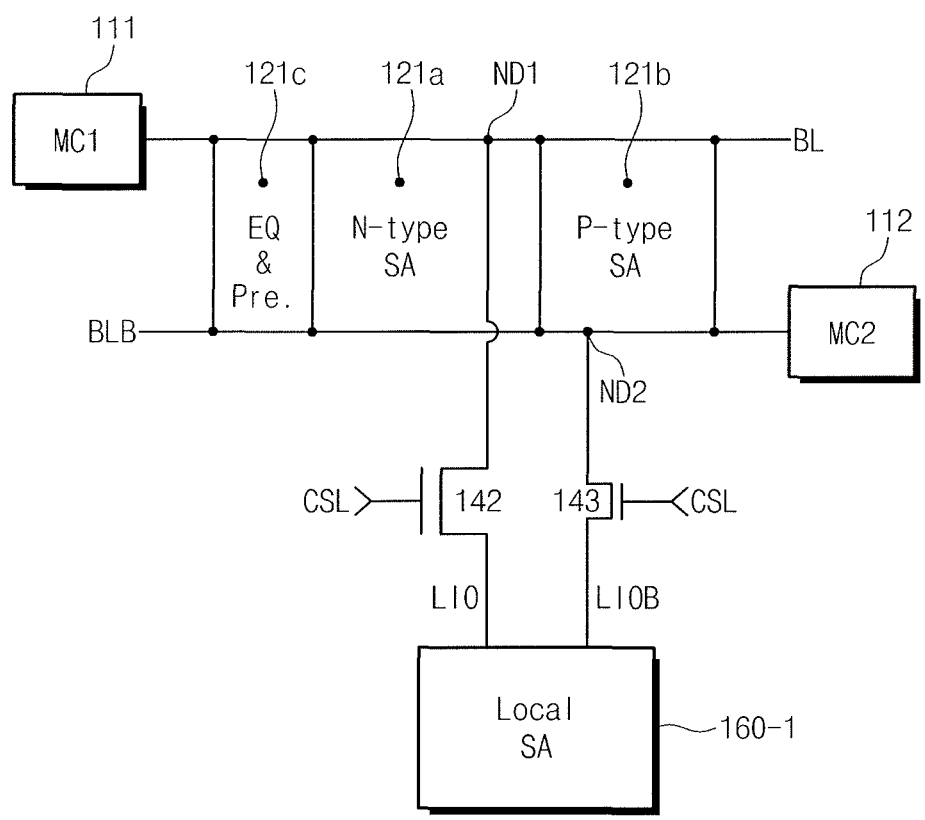
FIG. 4 illustrates an embodiment of a disposal structure of column select gates.

FIG. 4 illustrates an embodiment of a disposal structure of column select gates. In FIG. 4, in order to increase current drive ability, the size of the first column select gate 142 in a relatively long line is greater than a size of the second column select gate 143 in a relatively short line. The folded type bit line sense amplifier may include, for example, an N-type sense amplifier 121a and a P-type sense amplifier 121b.

Since a line between a connection node ND1 of a bit line BL and a drain of the first column select gate 142 is longer than a line between a connection node ND2 of a complementary bit line BLB and a drain of the second column select gate 143, the length of the line is increased. Since an interconnection resistance of the line with increased length is greater than an interconnection resistance of a short line, the size of the first column select gate 142 may be greater than the size of the second column select gate 143. The first and second column select gates 142 and 143 may include, for example, an N-type MOS transistors driven by a column select signal CSL.

A reference numeral 121C is a precharge and equalize unit for precharging a bit line pair to a precharge voltage and equalizing an electric potential of the bit line pair.

When a first memory cell 111 is accessed in a bit line structure of FIG. 4, a second memory cell 112 is not accessed. Also, for a sensing operation of the bit line sense amplifier, when electric potential of the bit line BL is high, an electric potential of the complementary bit line BLB become low. Also, in a sensing operation of the bit line sense amplifier, when the electric potential of the bit line BL is low, the electric potential of the complementary bit line BLB is high.

In accordance with at least one embodiment, increasing the size of a column select gate disposed in a relatively long line to be greater than the size of a column select gate disposed in a relatively short line as illustrated in FIG. 4 allows the difference of a bit line interconnection resistance to be compensated.

Figure 5:
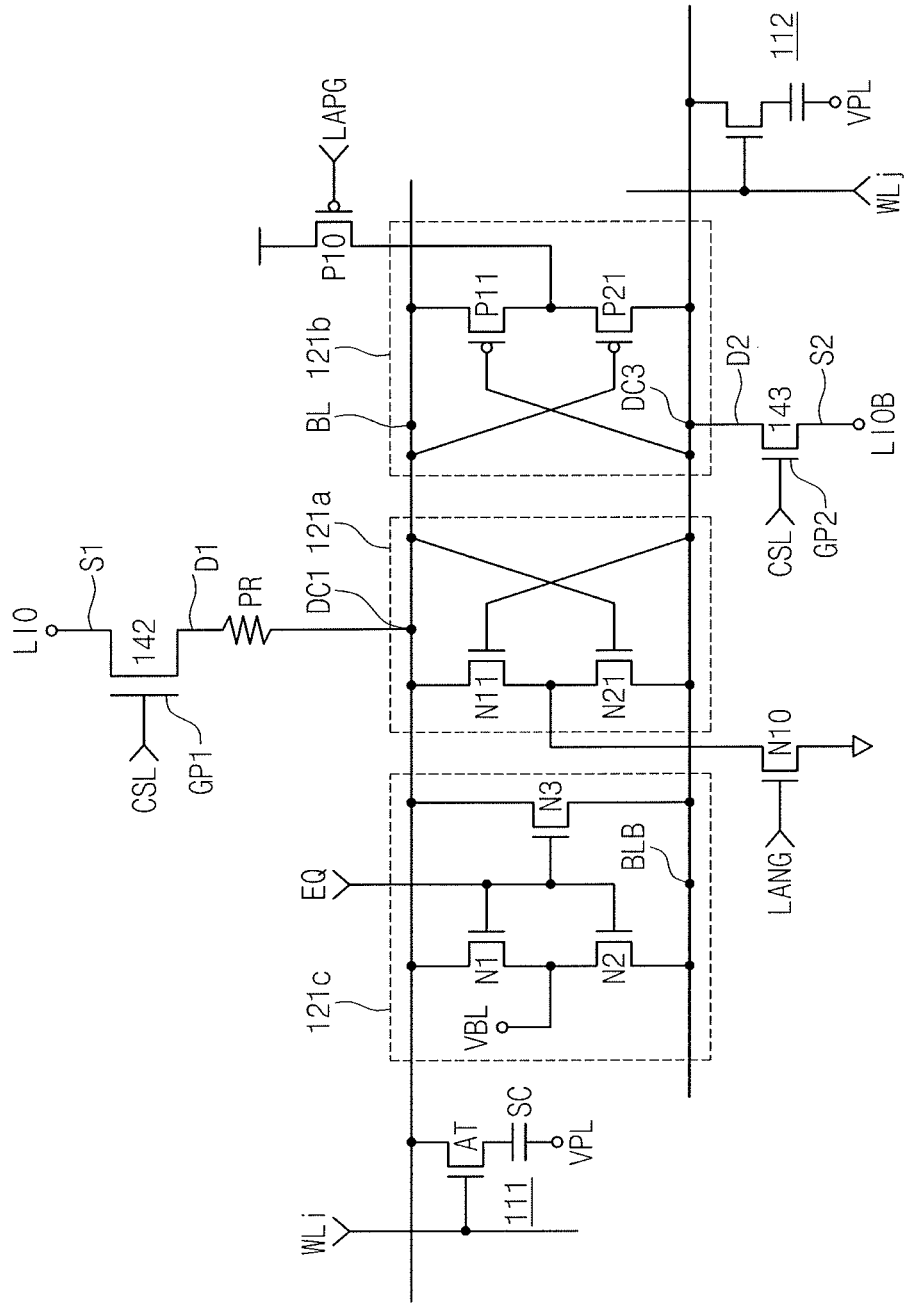
FIG. 5 illustrates an embodiment of a circuit diagram for the structure of FIG. 4.

FIG. 5 illustrates an embodiment of a detailed circuit diagram of a connection structure in FIG. 4. Referring to FIG. 5, the connection structure includes an N-type sense amplifier 121a, a P-type sense amplifier 121b, a precharge and equalize unit 121C, and first and second column select gates 142 and 143.

The memory cell 111 may include one access transistor AT and one storage capacitor SC. The gate of the access transistor AT is connected to a word line WLi and the drain (or source) of the access transistor AT is connected to a bit line BL. A plate node of the storage capacitor SC may be connected to a plate voltage VPL.

The N-type sense amplifier 121a includes first and second N-type MOS transistors N11 and N21 having gates cross-coupled to a bit line pair. The N-type sense amplifier 121a is driven by an N-type drive transistor N10, which is driven in response to an N-type sense amplifier drive signal LANG.

The P-type sense amplifier 121b includes first and second P-type MOS transistors P11 and P21 having gates cross-coupled to a bit line pair. The P-type sense amplifier 121b is driven by a P-type drive transistor P10, which is driven based on to a P-type sense amplifier drive signal LAPG.

The precharge and equalize unit 121C includes first, second and third N-type MOS transistors N1, N2 and N3 connected to the bit line pair and having gates that receive an equalize signal EQ in common. A precharge signal is applied as a precharge voltage VBL.

A drain (or source) of the first column select gate 142 may be connected to the bit line BL through a direct contact DC1. A source (or drain) of the first column select gate 142 may be connected to the local input/output line LI0 through a direct contact (DC2 of FIG. 7). A gate of the first column select gate 142 is connected to a column select line to which a column select signal CSL is applied.

A drain (or source) of the second column select gate 143 may be connected to the complementary bit line BLB through a direct contact DC3. A source (or drain) of the second column select gate 143 may be connected to the complementary local input/output line LI0B through a direct contact (DC4 of FIG. 7). A gate of the second column select gate 143 is connected to a column select line to which a column select signal CSL is applied.

The first column select gate 142 is therefore disposed in a long line compared with the second column select gate 143, with the bit line pair to which a bit line sense amplifier is connected as the center. Thus, parasitic resistance PR is represented to refer to an increase in interconnection resistance.

Figure 6:
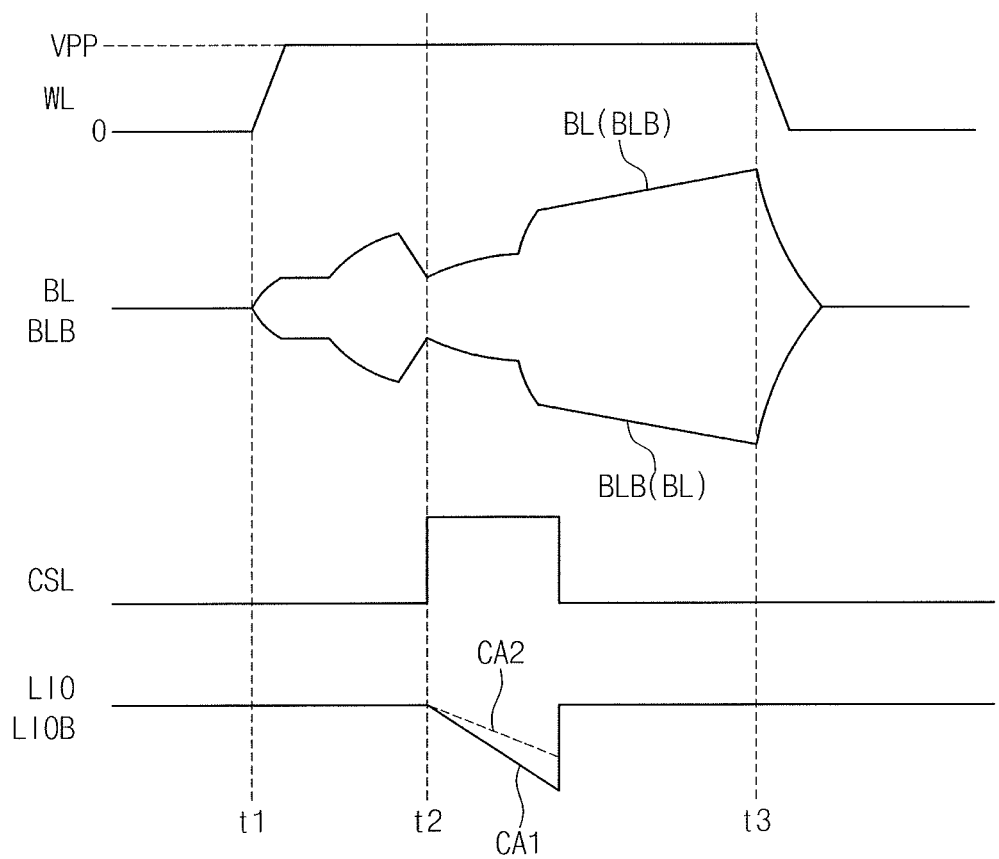
FIG. 6 illustrates an embodiment of operation timing diagram.

FIG. 6 illustrates an embodiment of an operation timing diagram in accordance with FIG. 5. Referring to FIG. 6, a high power supply voltage VPP is applied to a selected word line WL. A voltage of the bit line pair BL/BLB is developed according to charges stored in a selected memory cell. When a charge stored in the memory cell 111 is in a high electric potential representing data 1, an electric potential of the bit line BL begins to rise from after time t1. At the time t1, the high power supply voltage VPP is applied to a gate of the access transistor AT of the memory cell 111. Thus, charges stored in the storage capacitor SC of the memory cell 111 are applied to the bit line BL through a drain-source channel of the access transistor AT.

In this case, since a bit line charge sharing by charges corresponding to a high electric potential occurs, an electric potential of the bit line BL becomes slightly higher than an electric potential of the complementary bit line BLB precharged to a precharge voltage level. As a result, a level of a voltage applied to a gate of the N-type MOS transistor N21 of the N-type sense amplifier 121a becomes slightly higher than a level of a voltage applied to a gate of the N-type MOS transistor N11 of the N-type sense amplifier 121a. In this case, the N-type sense amplifier drive signal LANG of a high level is applied and thereby the N-type drive transistor N10 is turned on.

An electric potential of the complementary bit line BLB begins to be discharged to a ground through the N-type MOS transistor N21 and the N-type drive transistor N10. If an electric potential of the complementary bit line BLB begins to fall, a level of a voltage applied to a gate of the P-type MOS transistor P11 of the P-type sense amplifier 121b becomes lower than a level of a voltage being applied to a gate of the P-type MOS transistor P21 of the P-type sense amplifier 121b. Accordingly, the P-type MOS transistor P11 driven by the P-type drive transistor P10 begins to be strongly turned on and the P-type MOS transistor P21 becomes weakly turned on and then gradually goes toward a turn-off state. For example, an electric potential of the complementary bit line BLB rises from a precharge voltage level toward a power supply voltage level, and an electric potential of the complementary bit line BLB falls from the precharge voltage level toward a ground voltage level.

When charges stored in a memory cell are in a low electric potential representing data 0, an electric potential of the bit line BL begins to fall from after the time t1. The time t1 represents an active operation beginning of activating a selected word line, time t2 represents a sensing operation beginning of the bit line sense amplifier, and time t3 represents a precharge operation beginning of after a sensing operation is completed. At the time t2, a column select signal is applied and an electric potential amplified by the bit line pair is transferred to a local input/output line pair.

In FIG. 6, a current drive ability of a column select transistor transferring a low electric potential to the local input/output line LI0 is illustrated, assuming that a charge stored in a memory cell represents data 0. When a current drive ability of the column select transistor is greater than that of a column select transistor having a relatively small size, as illustrated through a reference character numeral CA1, there may be a difference in a drive ability compared with a reference character numeral CA2.

On the contrary, when assuming that a charge stored in a memory cell represents data 1, since a current drive ability of a column select transistor transferring a high electric potential to the local input/output line LI0 is greater than that of a column select transistor having a relatively small size, a difference of a bit line interconnection resistance is compensated.

Figure 7:
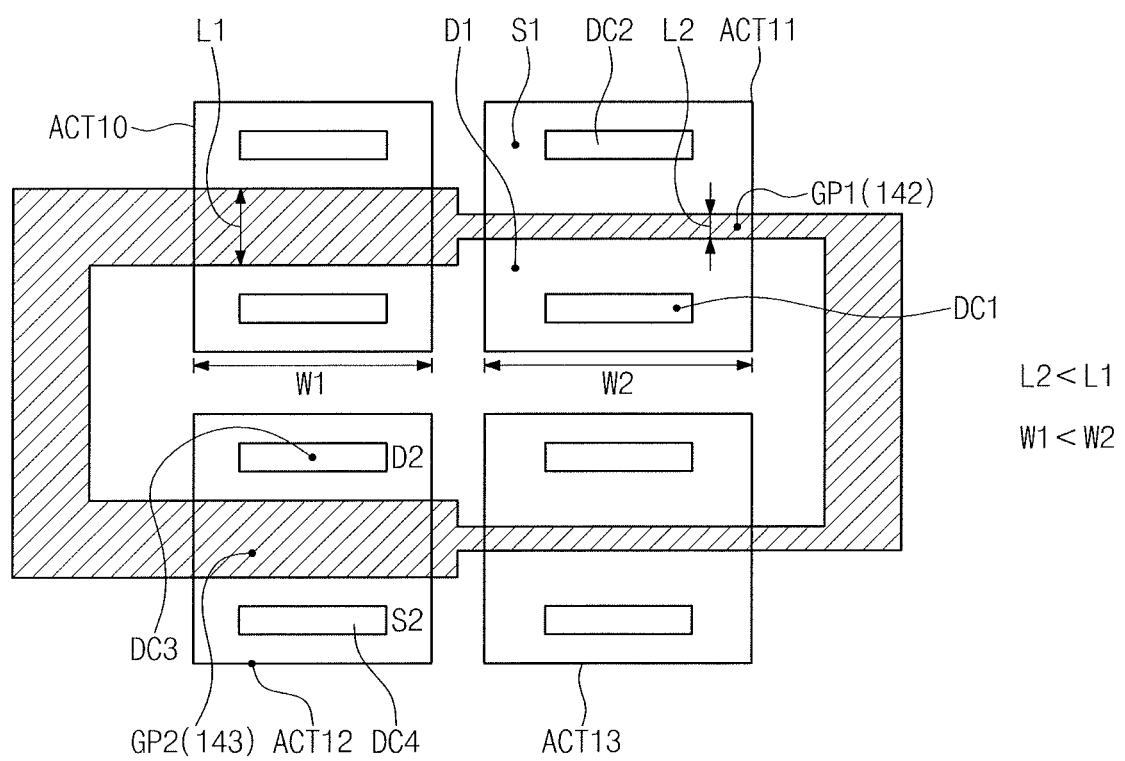
FIG. 7 illustrates another embodiment of a disposal structure of column select gates.

FIG. 7 illustrates an embodiment of a disposal structure diagram of column select gates in FIG. 4. Referring to FIG. 7, a total of four N-type MOS transistors are disposed which include column select gates constituted together with the first and second column select gates. A ring gate including polysilicon is disposed as a common gate of four N-type MOS transistors.

Since a length L2 of a gate poly GP1 of the first column select gate 142 is smaller than a length L1 of a gate poly GP2 of the second column select gate 143, a difference of a bit line interconnection length may be compensated. Reference character numeral ACT11 indicates an active area of the first column select gate 142. S1 indicates a source area corresponding to the source of FIG. 5, and D1 indicates a drain area corresponding to the drain of FIG. 5. DC1 represents a contact corresponding to the direct contact DC1 of FIG. 5. By a formation of the direct contact DC1, a drain area D1 of the first column select gate 142 relatively disposed on the bottom is electrically connected to a bit line BL relatively disposed at the top. The DC2 is a direct contact electrically connecting between the source area S1 of the first column select gate 142 and the local input/output line LI0.

A reference character numeral ACT12 indicates an active area of the second column select gate 143, S2 indicates a source area corresponding to the source of FIG. 5, and D2 indicates a drain area corresponding to the drain of FIG. 5. DC3 represents a contact corresponding to the direct contact DC3 of FIG. 5. By a formation of the direct contact DC3, a drain area D2 of the second column select gate 143 relatively disposed on the bottom is electrically connected to a complementary bit line BLB relatively disposed at the top. DC4 is a direct contact electrically connected between the source area S2 of the second column select gate 143 and the complementary local input/output line LI0B. The remaining two active areas ACT10 and ACT13 are for column select gates connected to an adjacent bit line sense amplifier.

Figure 8A:
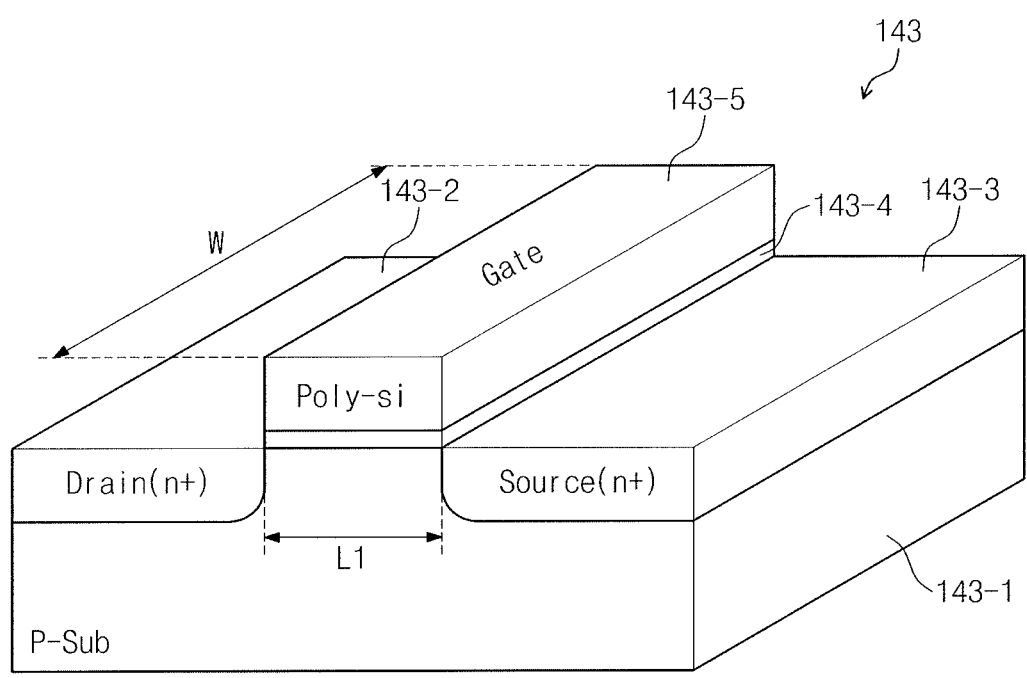
FIGS. 8A and 8B illustrate an embodiment of column select gates having a three-dimensional structure.

As illustrated in FIG. 8A, the current drive ability of a column select gate connected to a relatively long line becomes greater than a current drive ability of a column select gate connected to a relatively short line, by making a gate length of the column select gate connected to the relatively long line smaller than a gate length of the column select gate connected to the relatively short line.

The current drive ability of a column select gate connected to a relatively long line becomes large by enlarging a gate width W, like FIG. 9, without changing a gate length. As a result, the difference of a bit line interconnection resistance is compensated.

Figure 8B:
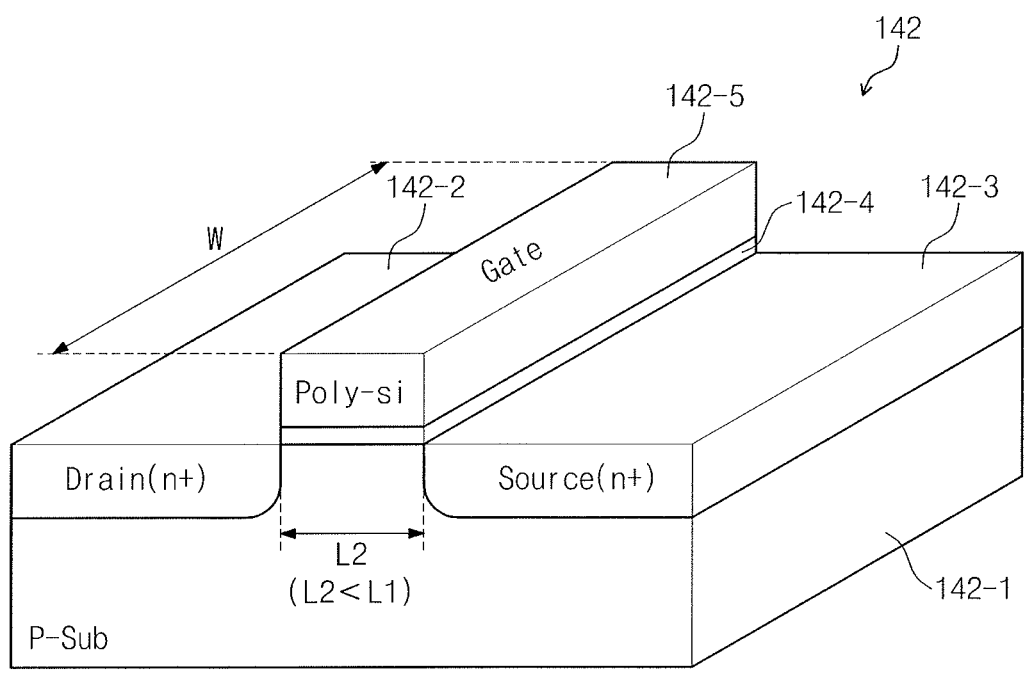

FIGS. 8A and 8B illustrate embodiments of column select gates in accordance with FIG. 7 having three-dimensional structures. In particular, FIG. 8A illustrates a three-dimensional structure of the second column select gate 143, and FIG. 8B illustrates a three-dimensional structure of the first column select gate 142.

In FIG. 8A, to manufacture the second column select gate 143, a drain area 143-2 and a source area 143-3 are in a P-type substrate 143-1, a gate layer 143-5 formed of polysilicon is on the P-type substrate 143-1, and a gate insulation layer 143-4 is between the gate layer 143-5 and the P-type substrate 143-1.

In FIG. 8B, since a gate length L2 of the first column select gate 142 is smaller than a gate length L1 of the second column select gate 143 of FIG. 8A, the current drive ability of the first column select gate 142 becomes greater than the current drive ability of the second column select gate 143, thereby compensating a difference of bit line interconnection resistance.

Also, in FIG. 8B, to manufacture the first column select gate 142, a drain area 142-2 and a source area 142-3 are in a P-type substrate 142-1, a gate layer 142-5 formed of polysilicon is on the P-type substrate 142-1, and a gate insulation layer 142-4 is between the gate layer 142-5 and the P-type substrate 142-1.

Figure 9A:
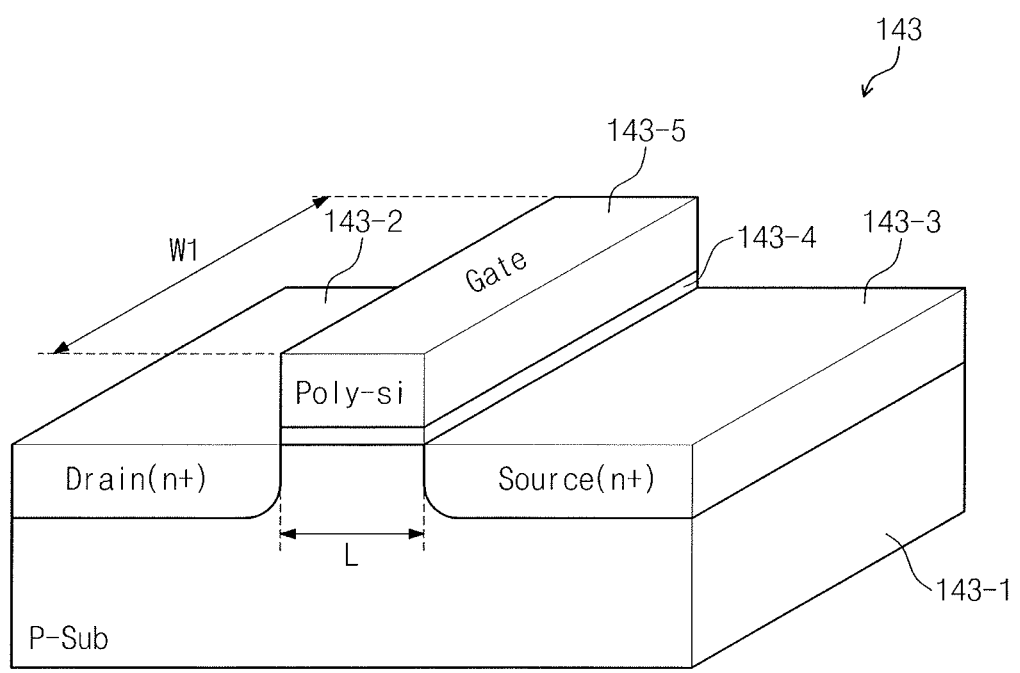
FIGS. 9A and 9B illustrate another embodiment of column select gates having a three-dimensional structure.
Figure 9B:
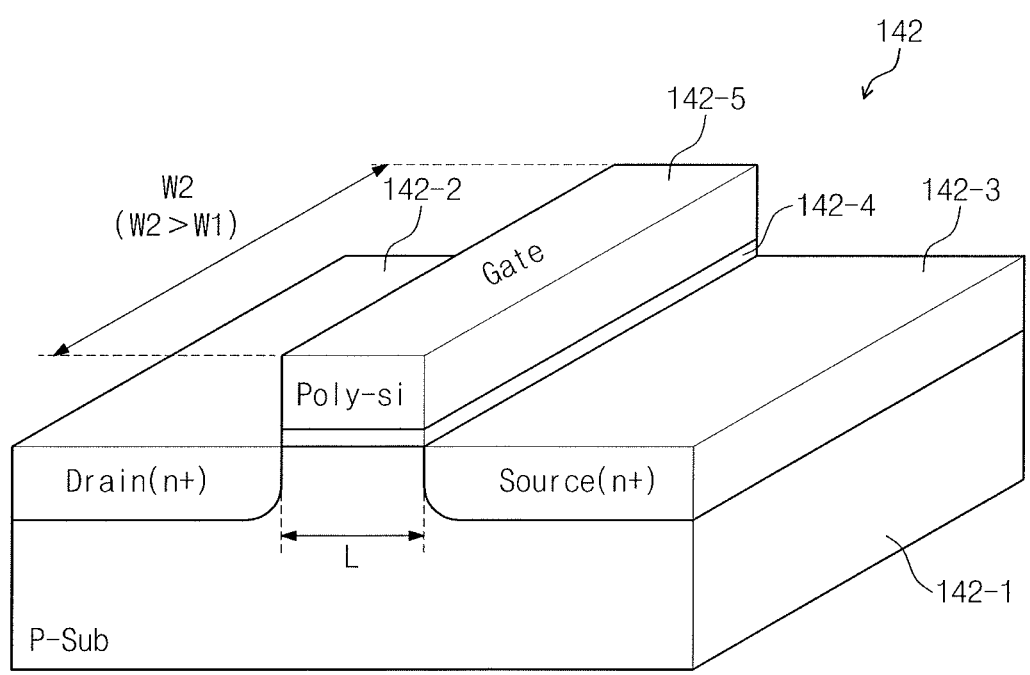

FIGS. 9A and 9B illustrate embodiments of three-dimensional structure diagrams of column select gates in accordance with a modified example of FIG. 7. In particular, FIG. 9A illustrates a three-dimensional structure of the second column select gate 143 and FIG. 9B illustrates a three-dimensional structure of the first column select gate 142.

In FIG. 9A, to manufacture the second column select gate 143, a drain area 143-2 and a source area 143-3 are in a P-type substrate 143-1, a gate layer 143-5 formed of polysilicon is on the P-type substrate 143-1, and a gate insulation layer 143-4 is between the gate layer 143-5 and the P-type substrate 143-1.

In FIG. 9B, since a gate width W2 of the first column select gate 142 is greater than a gate width W1 of the second column select gate 143 of FIG. 9A, the current drive ability of the first column select gate 142 becomes greater than the current drive ability of the second column select gate 143. As a result, a difference of bit line interconnection resistance is compensated.

Also, in FIG. 9B, to manufacture the first column select gate 142, a drain area 142-2 and a source area 142-3 are in a P-type substrate 142-1, a gate layer 142-5 formed of polysilicon is on the P-type substrate 142-1, and a gate insulation layer 142-4 is between the gate layer 142-5 and the P-type substrate 142-1.

Figure 10:
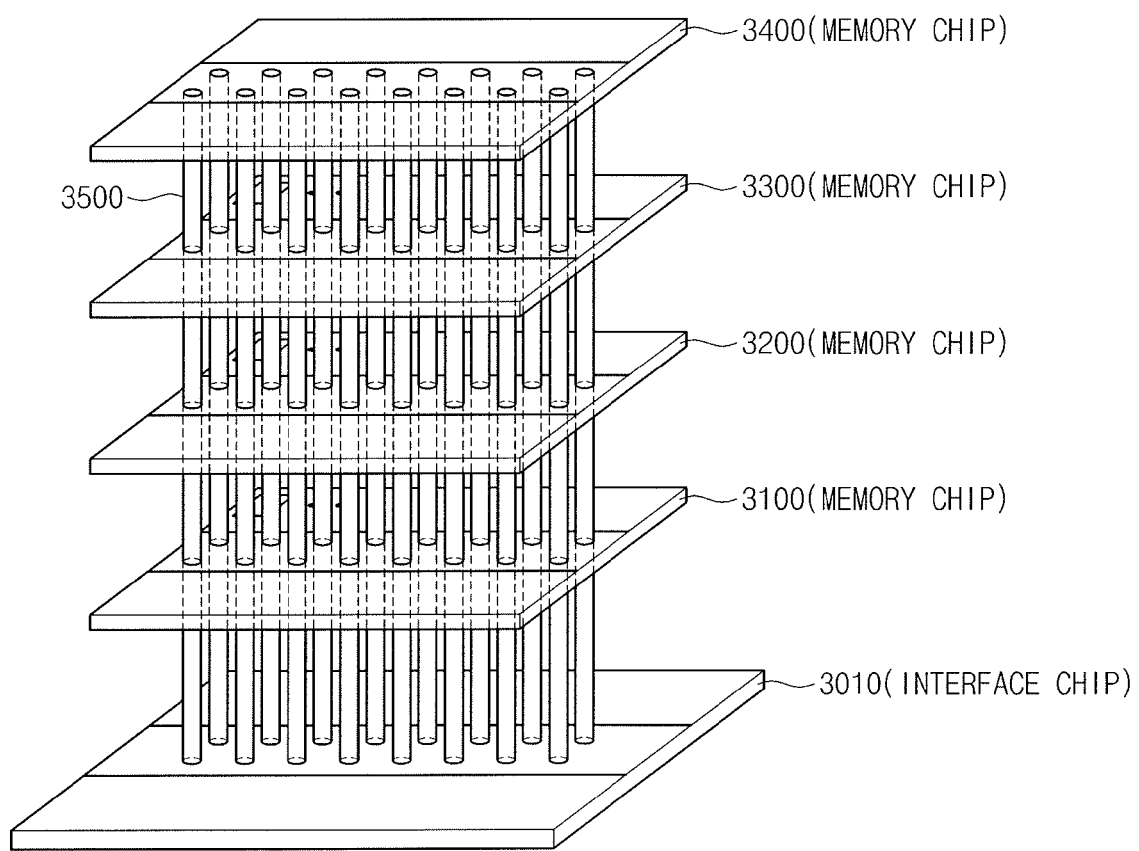
FIG. 10 illustrates an embodiment for a stacked memory module.

FIG. 10 illustrates an embodiment for a memory module stacked through a TSV. Referring to FIG. 10, an interface chip 3010 is located on the lowest layer and memory chips 3100, 3200, 3300, and 3400 are disposed on the interface chip 3010. A command, an address, and data may be transferred between the chips through a TSV (through silicon via). The number of stacked chips may be two or more.

The memory chips are included in the memory module, and the memory module may be connected to a memory controller. Since the memory chips 3100, 3200, 3300, and 3400 include column select gates of different sizes connected to a bit line sense amplifier, the difference of bit line interconnection resistance is compensated. Thus, a core margin (e.g., tRCD, tRDL, etc.) of the memory chips in the memory module is improved.

Figure 11:
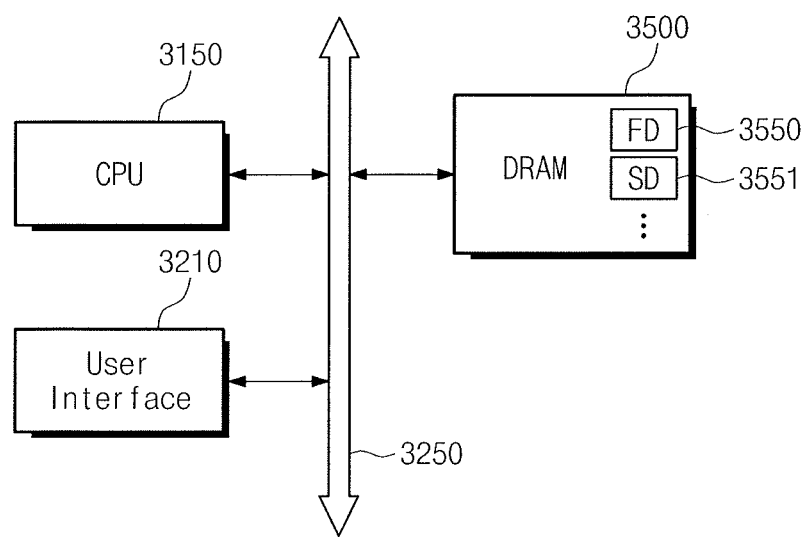
FIG. 11 illustrates an embodiment for an electronic system.

FIG. 11 illustrates an embodiment for an electronic system which includes a RAM 3500, a central processing unit CPU 3150, and a user interface 3210 connected to one another through a system bus 3250. In the case that the electronic system is a portable electronic device, a separate interface may be connected to an external communication device. The communication device may be, for example, a DVD (digital versatile disc) player, a computer, a set top box STB, a game machine, or a digital camcorder.

The DRAM 3500 may include two or more dies in one package. For example, the DRAM 3500 may be packaged using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

A flash memory or another type of nonvolatile storage device may be connected to the system bus 3250. The nonvolatile storage stores data information of various types such as a text, a graphic, a software code, etc.

Since the DRAM 3500 may include column select gates of different sizes connected to a bit line sense amplifier, like FIG. 4, the difference in bit line interconnection resistance is compensated. Thus, since a core AC margin such as TRCD, TRDL, etc., of the DRAM 3500 is improved, operation performance of an electronic system is improved. Instead of a DRAM, an MRAM may correspond to the memory in FIG. 11.

A volatile semiconductor memory device such as a SRAM or a DRAM loses its stored data when its power is interrupted. A nonvolatile semiconductor memory device such as a MRAM retains its stored data even when its power is interrupted. Thus, in order to prevent loss of data, for example, when a power failure or power interruption occurs, a nonvolatile semiconductor memory device may be used to store data in accordance with one or more embodiments.

In the case that a STT-MRAM (spin transfer torque resistive random access memory) serves as the memory, an advantage of a MRAM may be added in addition to an advantage of a DRAM. For example, a STT-MRAM cell may include a MTJ (magnetic tunnel junction) device and a select transistor. The MTJ device may include, for example, a tunnel layer between a fixed layer and a free layer. The magnetization direction of the fixed layer is fixed, and the magnetization direction of the free layer may be the same as the fixed layer or may be reverse to that of the fixed layer.

Figure 12:
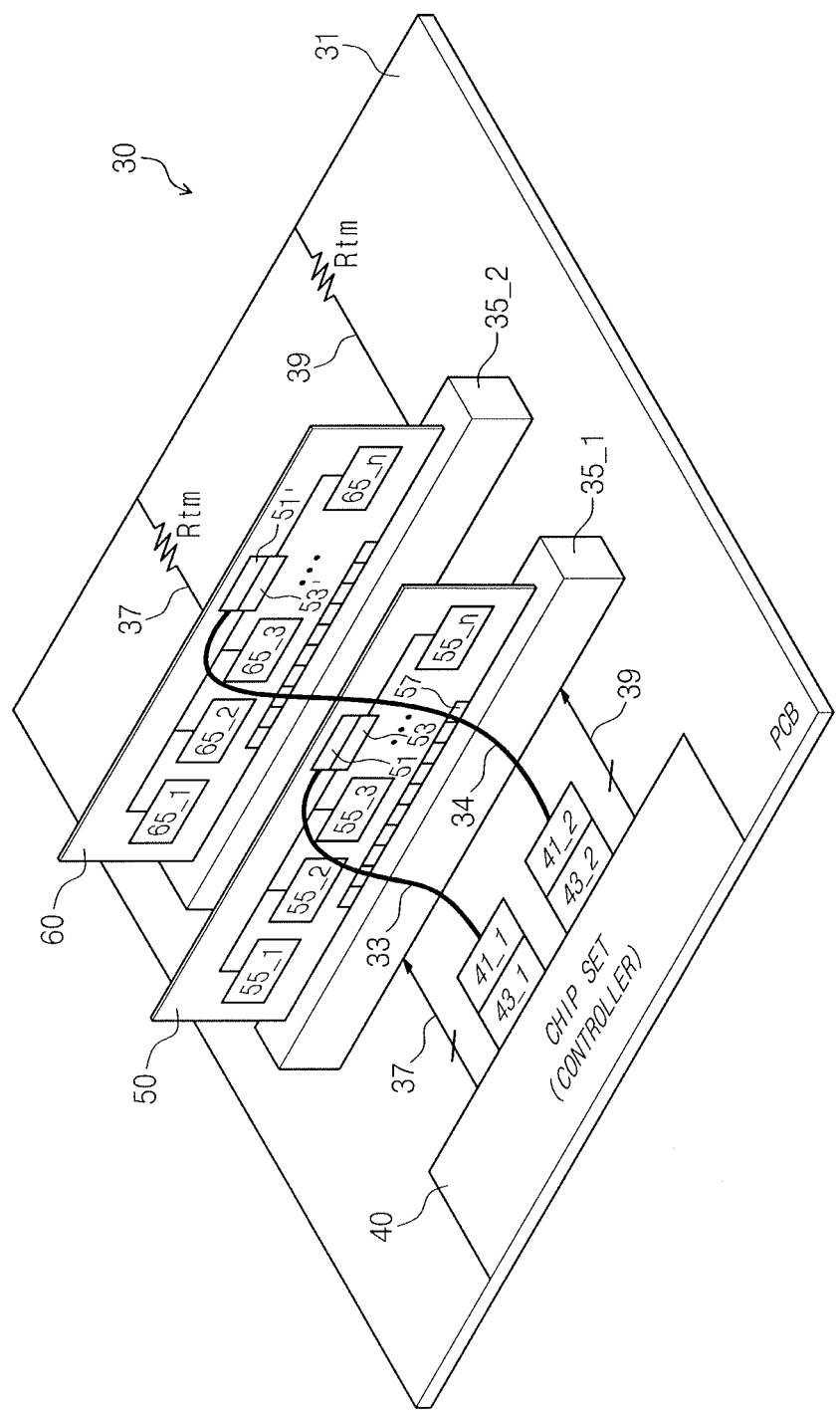
FIG. 12 illustrates an embodiment for an optical I/O schema.

FIG. 12 illustrates an embodiment for an optical I/O schema. Referring to FIG. 12, a memory system 30 adopting a high speed optic I/O may include a chipset 40 that functions as a memory controller and a plurality of memory modules 50 and 60 that are loaded on a PCB 31. The memory modules 50 and 60 are inserted into slots 35_1 and 35_2 respectively installed on the PCB 31. The memory module 50 may include a connector 57, multi channel DRAMs 55_1~55_n, an optical I/O input unit 51, and an optical I/O output unit 53.

The optical I/O input unit 51 may include a photoelectric conversion device for converting an optical signal (e.g., photodiode) to an electrical signal. An electrical signal output from the photoelectric conversion device is received by the memory module 50. The optical I/O output unit 53 may include, for example, an electrophotic conversion device (e.g., a laser diode) for converting an electrical signal output from the memory module 50 to an optical signal. The optical I/O output unit 53 may optionally include an optical modulator for modulating a signal output from a light source.

The optical cable 33 is in charge of an optical communication between the optical I/O input unit 51 of the memory module 50 and an optical transmission unit 41_1 of the chipset 40. The optical communication may have a bandwidth of more than several tens of Giga bits per second. The memory module 50 receives signals or data from signal lines 37 and 39 of the chipset 40 through the connector 57 and performs high speed data communication with the chipset 40 through the optical cable 33. Resistors Rtm on lines 37 and 39 are termination resistors.

Even when the memory system 30 adopts the optical I/O structure illustrated in FIG. 12, since a DRAM includes column select gates of different sizes connected to a bit line sense amplifier like FIG. 4, a difference in bit line interconnection resistance is compensated. Thus, read error of the memory system 30 is reduced or prevented to thereby improve performance of a read operation. In the memory system of FIG. 12, the multi channel DRAMs 55_1~55_n may be used as a user data buffer.

Figure 13:
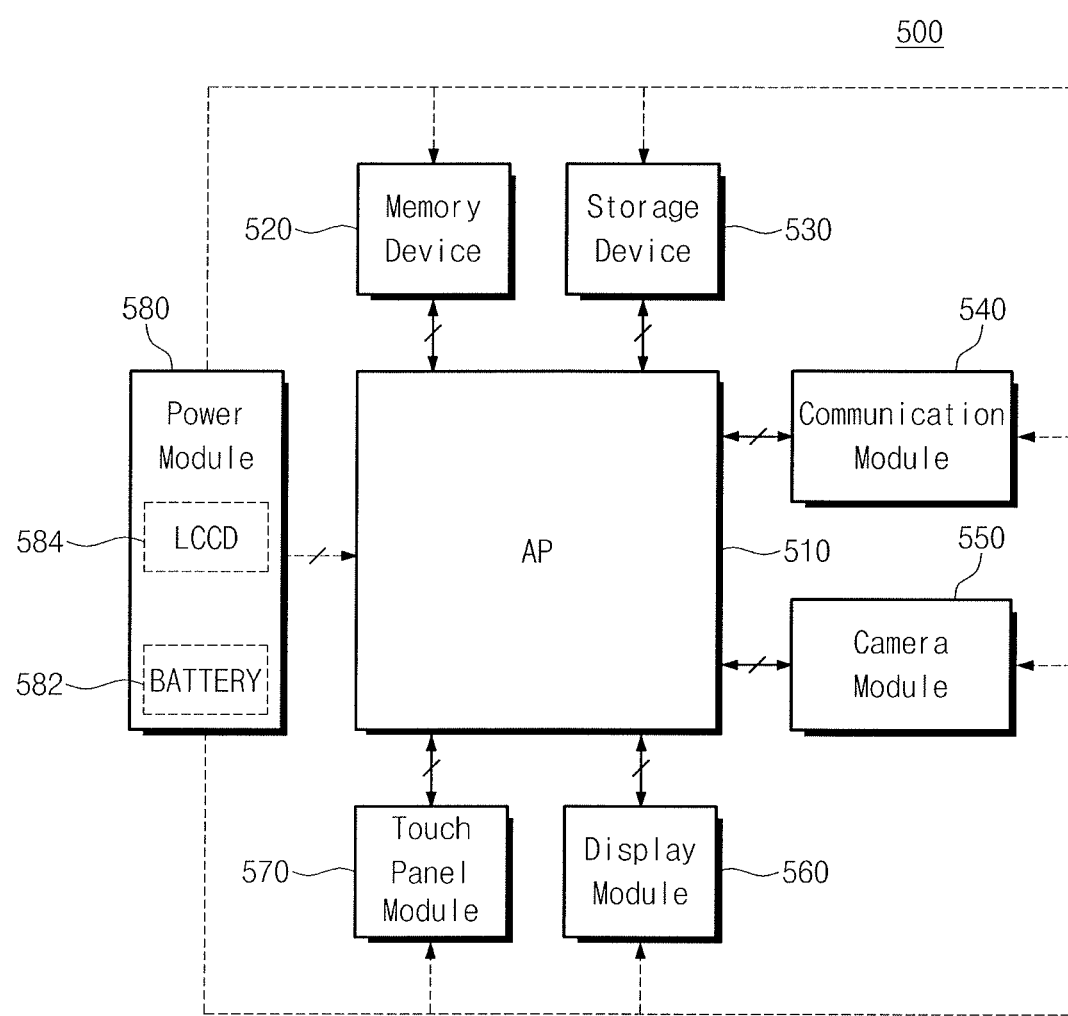
FIG. 13 illustrates an embodiment for a portable multimedia device.

FIG. 13 illustrates an embodiment for a portable multimedia device. Referring to FIG. 13, the portable multimedia device 500 includes an AP 510, a memory device 520, a storage device 530, a communication module 540, a camera module 550, a display module 560, a touch panel module 570 and a power module 580.

The AP 510 performs data processing functions.

The memory device 520 may be, for example, a DRAM which includes column select gates of different sizes connected to a bit line sense amplifier. Thus, like FIG. 4, a difference in bit line interconnection resistance is compensated. Accordingly, a core AC margin of the memory device is improved and operation performance of the portable multimedia device 500 is improved.

The communication module 540 connected to the AP 510 may function as a modem performing a transmission/reception of communication data and a data modulation/demodulation function.

The storage device 530 may be, for example, a NOR-type or NAND-type flash memory to store high capacity information.

The display module 560 may include, for example, liquid crystal having a backlight, or a liquid crystal having a LED light source or an OLED. The display module 560 functions as an output device displaying an image such as a character, a number, a picture, etc., in color.

The touch panel module 570 provides a touch input to the AP 510 single-handed or on the display module 560. The portable multimedia device may be a mobile communication device and/or may function as a smart device by adding or subtracting constituent elements. The portable multimedia device may connect a separate interface to an external communication device. The communication device may be, for example, a DVD (digital versatile disc) player, a computer, a set top box STB, a game machine, a digital camcorder, etc.

The power module 580 performs power management of the portable multimedia device. When a PMIC scheme is applied in the portable multimedia device, power shaving of the portable multimedia device is accomplished.

The camera module 550 includes a camera image processor CIS and is connected to the AP 510. The portable multimedia device may further include another application chipset or a mobile DRAM.

Figure 14:
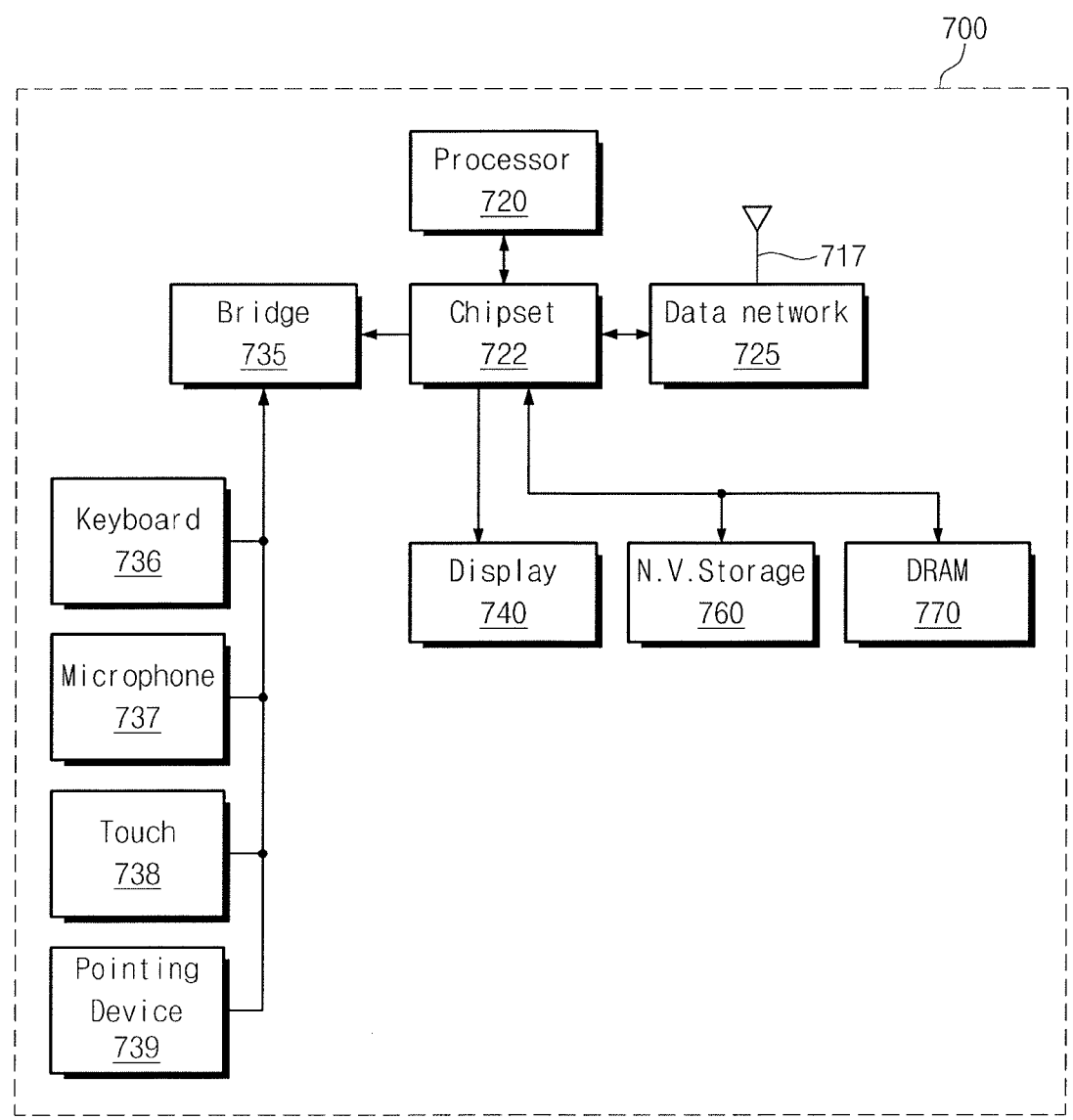
FIG. 14 illustrates an embodiment for a personal computer.

FIG. 14 illustrates an embodiment for a personal computer 700. Referring to FIG. 14, the personal computer 700 includes a processor 720, a chipset 722, a data network 725, a bridge 735, a display 740, a nonvolatile storage 760, a DRAM 770, a keyboard 736, a microphone 737, a touch unit 738, and a pointing device 739.

The DRAM 770 may correspond, for example, to the one in FIG. 1. Since the DRAM 770 includes column select gates of different sizes connected to a bit line sense amplifier like FIG. 4, a difference in line interconnection resistance is compensated. Thus, since a core AC margin such as TRCD, TRDL, etc. of the DRAM 770 is improved, operation performance of the personal computer 700 is improved.

The chipset 722 may apply a command, an address, data, or control signals to the DRAM 770. The processor 720 functions as a host and controls an overall operation of the personal computer 700. A host interface between the processor 720 and the chipset 722 includes various types of protocols for performing a data communication.

The nonvolatile storage 760 may be, for example, an electrically erasable programmable read-only memory (EEPROM), a flash memory, a magnetic random access memory (MRAM), a spin-transfer torque MRAM, a conductive bridging RAM (CBRAM), a ferroelectric RAM (FeRAM), or a phase change RAM (PRAM) which is called an ovonic unified memory (OUM).

The personal computer 700 may serve as or may be connected to various electronic devices such as an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder, a digital video player, a storage constituting a data center, a device that can transmit and receive information in a wireless environment, one of various electronic devices constituting a home network, one of various electronic devices constituting a computer network, one of various electronic devices constituting a telematics network, and one of various constituent elements constituting a RFID device or a computing system.

Figure 15:
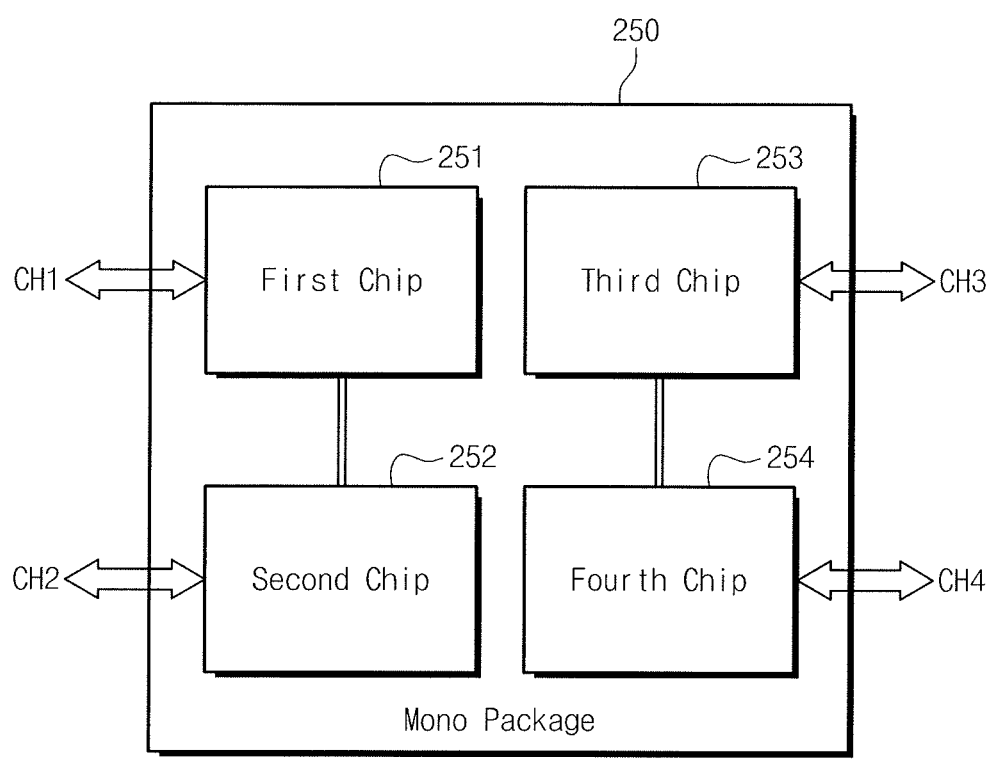
FIG. 15 illustrates an embodiment for a multichannel semiconductor memory.

FIG. 15 illustrates an embodiment for a multichannel semiconductor memory device 250 which includes four chips 251, 252, 253 and 254 including four dies. One die corresponds to one chip. A first chip among the chips is a first die manufactured on a wafer. A second chip may be a second die manufactured on the same wafer as the above wafer or a different wafer from the above wafer.

A die may correspond to an individual chip manufactured on a wafer. A plurality of dies may be manufactured at once on a wafer and then separated through various semiconductor processes to individual chips. Various semiconductor processes may be used to manufacture the wafer/dies. Examples include an oxidation process, a photolithographic process, a thin film formation process, an etch process, or a CMP process.

A first interconnection is between the first and second chips 251 and 252 and a second interconnection is between the third and fourth chips 253 and 254. The multichannel semiconductor device 250 in a mono package includes four channels. The first and second chips 251 and 252 are two dies, but the same data input/output operation may be performed by a 2-channel semiconductor memory device manufactured in a mono die. The third and fourth chips 253 and 254 are two dies, but the same data input/output operation may be performed by the 2-channel semiconductor memory device manufactured in the mono die.

The multichannel semiconductor device 250 may include a DRAM like FIG. 1. Since the DRAM includes column select gates of different sizes connected to a bit line sense amplifier like FIG. 4, a difference in bit line interconnection resistance is compensated. A core margin such as tRCD, tRDL, etc. of the DRAM is improved and thereby read operation performance may be robust.

Figure 16:
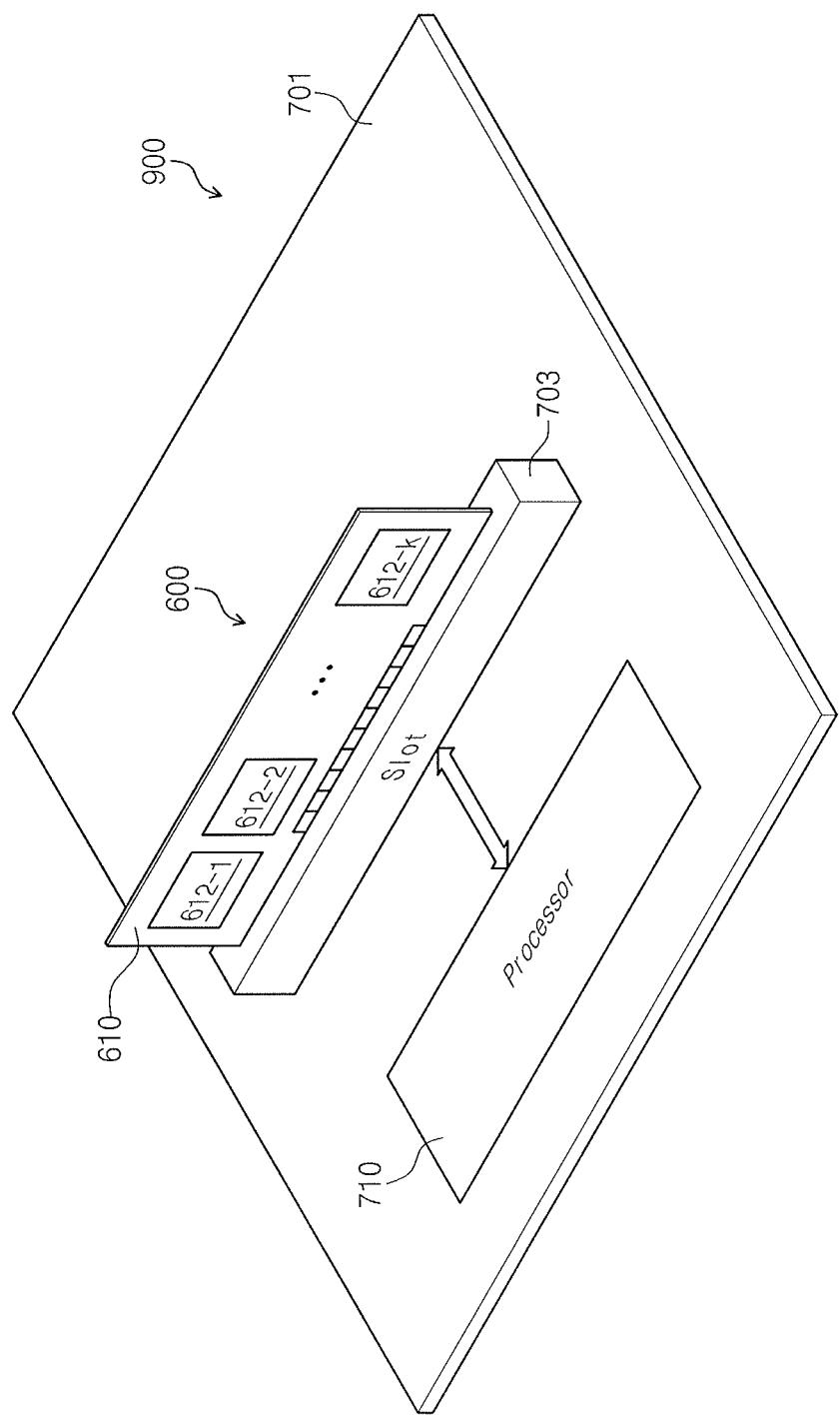
FIG. 16 illustrates an embodiment for a memory system.

FIG. 16 illustrates an embodiment for a memory system 900, which, for example, may be applied to a PC (personal computer), a laptop computer, or a server. The memory system 900 includes a slot 703 and a processor 710 that are built on a main board 701. Each of memory devices 612-1~612-k of a memory module 600 may exchange data with the processor 710 through the slot 703 and the main board 701. The processor 710 may be a microprocessor, a FPGA, or a chipset.

Since the memory devices 612-1~612-k include column select gates of different sizes connected to a bit line sense amplifier like FIG. 4, a difference in bit line interconnection resistance is compensated. Thus, operation performance of the memory system is improved.

Figure 17:
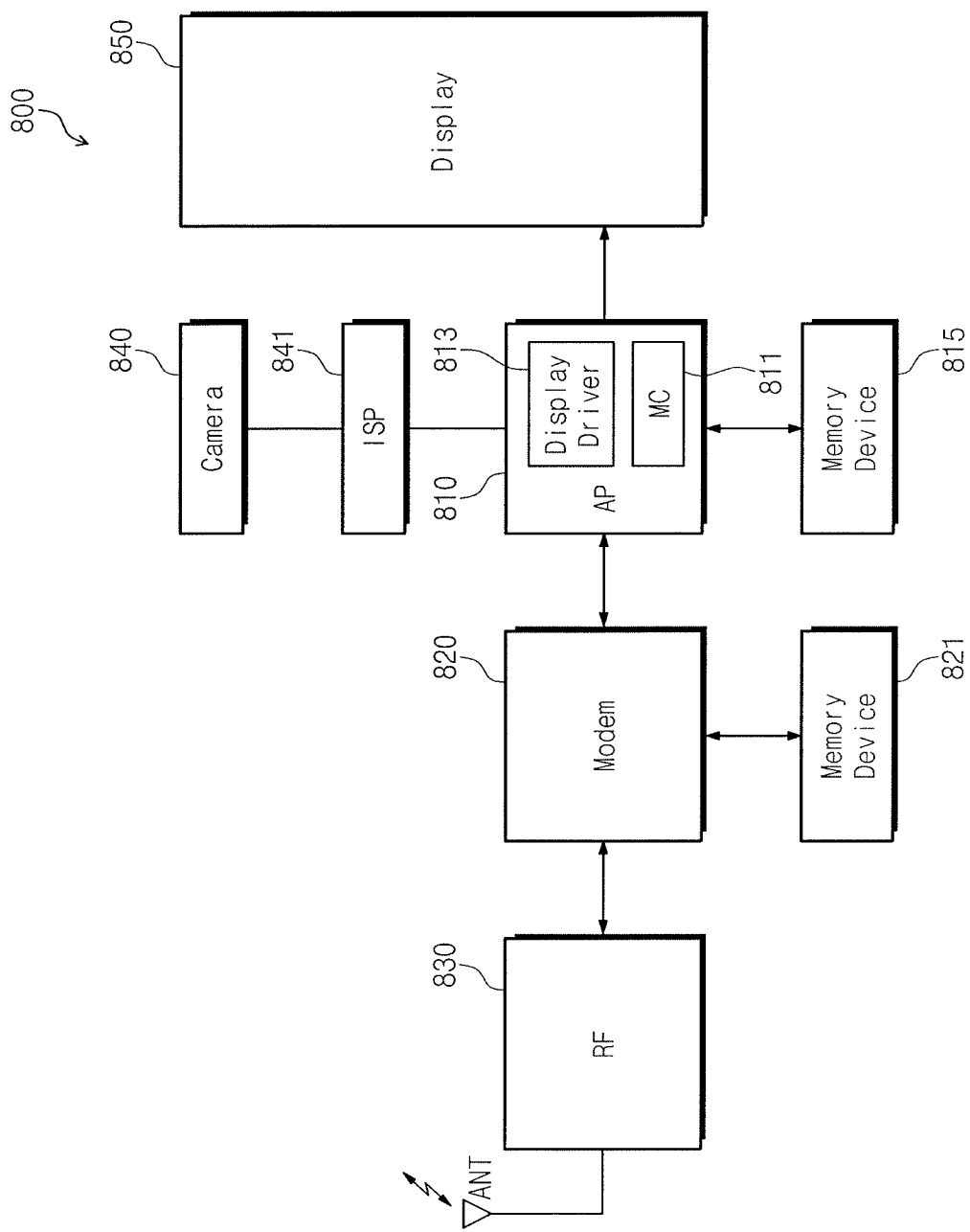
FIG. 17 illustrates an embodiment for a smart phone.

FIG. 17 illustrates an embodiment for a smart phone 800 embodied by a mobile computing device. The mobile computing device may be or connected to, for example, a laptop computer, a cellular phone, a smart phone, a tablet PC, a PDA (personal digital assistant), an EDA (enterprise digital assistant), a digital still camera, a PMP (portable multimedia player), a PND (personal navigation device or portable navigation device), a handheld game console, or an e-book.

An application processor AP 810, for example, a mobile application processor 810, may control operations of constituent elements 815, 820, 841 and 850. The structure and operation of each of memory device 815 and 821 may be the same as those of FIG. 1. Each of the memory devices 815 and 821 may be embodied by one memory device. A memory controller in the application processor 810 may control an access operation with respect to the memory device 815.

A display driver 813 in the application processor 810 may control an operation of a display 850. The display 850 may be embodied by a TFT-LCD (thin film transistor liquid crystal display), a LED (light-emitting diode) display, an OLED (organic LED) display, an AMOLED (active-matrix OLED) display, or a flexible display.

The modem 820 may interface data exchanged between a wireless transceiver 830 and the application processor 810. Data processed by a modem 820 may be stored in a memory device 821 or may be transferred to the application processor 810.

Wireless data received through an antenna ANT is transmitted to the modem 820 through the wireless transceiver 830. Data output from the modem 820 is converted into wireless data by the wireless transceiver 830 and the converted wireless data is output through an antenna ANT.

An image signal processor 841 may process a signal output from a camera (or an image sensor 840) and transmit the processed data to the application processor 810.

The application processor 810 may control at least one performance of a web browsing, an e-mail access, a video playback, a document editing and an image editing.

When each of the memory devices 815 and 821 includes a DRAM, the DRAM includes column select gates of different sizes connected to a bit line sense amplifier like FIG. 4. Thus, operation performance of the smart phone becomes powerful.

Figure 18:
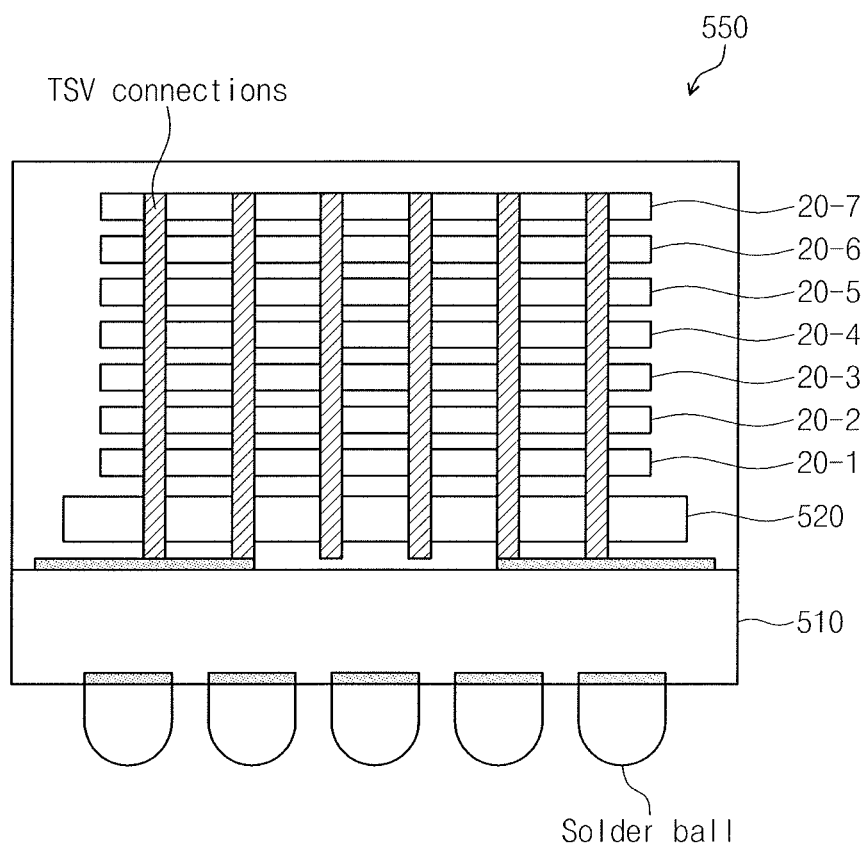
FIG. 18 illustrates another embodiment for a stacked memory system.

FIG. 18 illustrates an embodiment for a stacked memory system. As illustrated in FIG. 18, memory devices 20-1~20-7 in a memory system 550 may be stacked on a logic layer 520. The logic layer 520 may be stacked on a substrate 510. The structure and operation of each of the memory devices 20-1~20-7 may be the same as those of the semiconductor memory device of FIG. 1.

The memory devices 20-1~20-7, the logic layer 520, and the substrate 510 may be connected to one another through vertical electrical connections, for instance, TSVs (through silicon vias). At least one of the memory devices 20-1~20-7 may be replaced with a memory controller or a processor for controlling an operation of the memory devices 20-1~20-7.

Figure 19:
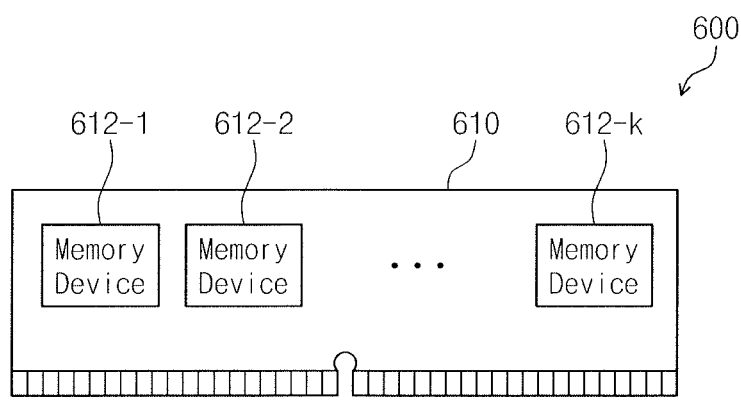
FIG. 19 illustrates an embodiment of a memory module.

FIG. 19 illustrates an embodiment of a memory module 600 applied to FIG. 16. As illustrated in FIG. 19, the memory module 600 includes a plurality of memory devices 612-1~621-k (k is an integer) mounted on a PCB (printed circuit board) 610. In the memory module 600, a tap area is inserted into the slot 703 built in the memory system 900 of FIG. 16 for electrical connection to the processor 710, or a memory controller is prepared on one surface of the PCB (printed circuit board) 610.

The structure and an operation of each of the memory devices 612-1~621-k may be substantially the same as the memory device in FIG. 1. The memory module 600 may be, for example, a SIMM (single in-line memory module), a DIMM (dual in-line memory module), a SIPP (single in-line pin package) memory, or a SO-DIMM (small outline DIMM).

Figure 20:
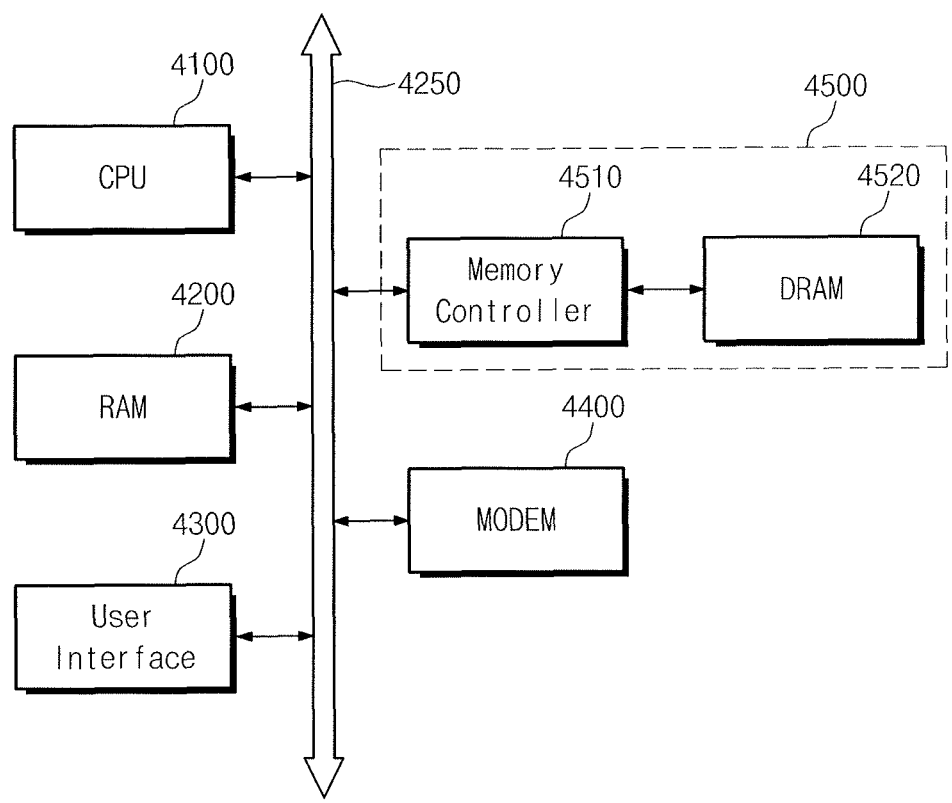
FIG. 20 illustrates an embodiment for a computing device.

FIG. 20 illustrates an embodiment for a computing device which includes a memory system 4500 having a DRAM 4520 and a memory controller 4510. The computing device may include an information processing device or a computer. The computing device may include, besides the memory system 4500, a modem 4400, a CPU 4100, a RAM 4200 and a user interface electrically connected to a system bus 4250. The memory system 4500 may store data processed by the CPU 4100 or data input from an external source.

In the case that the DRAM 4520 is a DDR4 DRAM, the DRAM 4520 may be on two or more dies in a mono package. Since the DRAM 4520 may include column select gates of different sizes connected to a bit line sense amplifier like FIG. 4, performance of a data read operation of the computing device is improved.

The computing device may be applied, for example, to a SSD (solid state drive), a camera image processor and an application chipset. The memory system 4500 may be constituted by a SSD and in this case, the computing device may stably and reliably store large amounts of data. The memory controller 4510 can apply a command, an address, data or a control signal to the DRAM 4520.

The CPU 4100 functions as a host and controls an overall operation of the computing device. A host interface between the CPU 4100 and the memory controller 4510 includes various protocols for performing a data exchange between the host and the memory controller 4510. The memory controller 4510 may communicate with the host or an external circuit through, for example, at least one of various interface protocols such as a USB (universal serial bus) protocol, a MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, a SCSI (small computer small interface) protocol, an ESDI (enhanced small disk interface) protocol, and an IDE (integrated drive electronics) protocol.

In accordance with one or more of the aforementioned embodiments, a difference in bit line interconnection resistance of a device connected to a bit line sense amplifier is minimized or reduced.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A semiconductor memory device, comprising:
   a memory cell array including a plurality of memory cells;
   a bit line sense amplifier to sense an electric potential difference between a bit line and a complementary bit line during a sensing operation for the memory cells;
   a first column select gate to transfer an electric potential on the bit line to a local sense amplifier based on a column select signal; and
   a second column select gate to transfer an electric potential on the complementary bit line to the local sense amplifier based on the column select signal, wherein the first and second column select gates have different sizes which correspond to different current drive abilities to compensate a difference in bit line interconnection resistance, wherein an interconnection length between the bit line and the first column select gate is different from an interconnection length between the complementary bit line and the second column select gate, and wherein, when an interconnection length between the complementary bit line and the second column select gate is greater than an interconnection length between the bit line and the first column select gate, the current drive ability of the second column select gate is greater than the current drive ability of the first column select gate.

2. The device as claimed in claim 1, wherein:
   when an interconnection length between the bit line and the first column select gate is longer than an interconnection length between the complementary bit line and the second column select gate, the current drive ability of the first column select gate is greater than the current drive ability of the second column select gate.

3. The device as claimed in claim 2, wherein a length of the first column select gate is less than a length of the second column select gate.

4. The device as claimed in claim 2, wherein a width of the first column select gate is greater than a width of the second column select gate.

5. The device as claimed in claim 2, wherein the first column select gate corresponds to an N-type MOS transistor.

6. The device as claimed in claim 1, wherein a length of the second column select gate is less than a length of the first column select gate.

7. The device as claimed in claim 1, wherein a width of the second column select gate is greater than a width of the first column select gate.

8. The device as claimed in claim 1, wherein the second column select gate corresponds to an N-type MOS transistor.

9. The device as claimed in claim 1, wherein the bit line sense amplifier is a folded type bit line sense amplifier.

10. A semiconductor memory device, comprising:
    a memory cell array having a plurality of memory cells, each of the memory cells including one access transistor and one storage capacitor;
    a cross-coupled type bit line sense amplifier to sense an electric potential difference of a bit line pair during a sensing operation for reading data stored in at least one memory cell of the plurality of memory cells; and
    first and second column select gates connected to the bit line sense amplifier to transfer an electric potential on the bit line pair to a local sense amplifier, wherein the first and second column select gates have different gate sizes from each other to compensate a difference in bit line interconnection length, wherein an interconnection length between a first bit line of the bit line pair and the first column select gate is different from an interconnection length between a second bit line of the bit line pair and the second column select gate, and wherein:
    when a bit line interconnection length of the first column select gate is greater than a bit line interconnection length of the second column select gate, a size of the first column select gate is greater than a size of the second column select gate, and
    the bit line sense amplifier is to perform a folded type sensing operation for the memory cell array.

11. The device as claimed in claim 10, wherein a length of the first column select gate is less than a length of the second column select gate.

12. The device as claimed in claim 10, wherein a width of the first column select gate is greater than a width of the second column select gate.

* * * * *